(12) United States Patent
Chang et al.

(10) Patent No.: US 8,582,682 B2
(45) Date of Patent: Nov. 12, 2013

(54) DIGITAL BROADCASTING TRANSMISSION/RECEPTION DEVICES CAPABLE OF IMPROVING A RECEIVING PERFORMANCE AND SIGNAL PROCESSING METHOD THEREOF

(75) Inventors: Yong-deok Chang, Suwon-si (KR); Hae-joo Jeong, Seoul (KR); Joon-soo Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 909 days.

(21) Appl. No.: 11/587,924

(22) PCT Filed: May 12, 2005

(86) PCT No.: PCT/KR2005/001398
§ 371 (c)(1),
(2), (4) Date: Oct. 26, 2006

(87) PCT Pub. No.: WO2005/120062
PCT Pub. Date: Dec. 15, 2005

(65) Prior Publication Data
US 2007/0268979 A1    Nov. 22, 2007

(30) Foreign Application Priority Data

| May 13, 2004 | (KR) | 10-2004-0033990 |
| May 11, 2005 | (KR) | 10-2005-0039309 |
| May 11, 2005 | (KR) | 10-2005-0039317 |

(51) Int. Cl.
*H04L 27/00* (2006.01)

(52) U.S. Cl.
USPC ........... 375/295; 375/265; 375/253; 375/263; 375/316; 375/324

(58) Field of Classification Search
USPC ................. 375/295, 265, 253, 263, 316, 324
See application file for complete search history.

(56) References Cited

U.S. PATENT DOCUMENTS

| 6,608,870 B1 | 8/2003 | Fimoff |
| 6,810,084 B1 | 10/2004 | Jun et al. |

(Continued)

FOREIGN PATENT DOCUMENTS

| CN | 1149795 A | 5/1997 |
| CN | 1168053 A | 12/1997 |

(Continued)

OTHER PUBLICATIONS

Chinese Office Action issued Mar. 20, 2009 in CN Application No. 200580015387.7.

(Continued)

*Primary Examiner* — Kabir A Timory
(74) *Attorney, Agent, or Firm* — Sughrue Mion, PLLC

(57) ABSTRACT

Disclosed is a digital broadcasting transmission/reception system having an improved reception performance and a signal-processing method thereof. A digital broadcasting transmitter comprises a TS stream generator for inputting robust and normal packets having stuff bytes in predetermined positions and generating dual TS stream by inserting the robust packets between the normal packets; a randomizer for randomizing the dual TS stream; a stuff byte exchanger for replacing the stuff bytes of a randomized data streams from the randomizer to a predetermined known data; and an encoder for encoding a data streams to which the known data is inserted. Accordingly, the present invention detects the known data from a signal received from a reception side and uses the detected known data for synchronization and equalization, so that the digital broadcasting reception performance can be improved at poor multipath channels.

60 Claims, 14 Drawing Sheets

(56) References Cited

U.S. PATENT DOCUMENTS

| | | | |
|---|---|---|---|
| 2002/0140867 A1* | 10/2002 | Weiss | 348/723 |
| 2002/0172277 A1* | 11/2002 | Choi et al. | 375/240.01 |
| 2002/0186780 A1* | 12/2002 | Choi et al. | 375/270 |
| 2002/0186790 A1* | 12/2002 | Choi et al. | 375/321 |
| 2003/0099303 A1 | 5/2003 | Birru et al. | |
| 2004/0032529 A1* | 2/2004 | Jeon et al. | 348/571 |
| 2004/0090352 A1 | 5/2004 | Jaffe et al. | |
| 2004/0237024 A1* | 11/2004 | Limberg | 714/784 |
| 2005/0249300 A1* | 11/2005 | Jeong et al. | 375/265 |
| 2005/0271158 A1* | 12/2005 | Birru | 375/270 |
| 2007/0268979 A1 | 11/2007 | Chang et al. | |
| 2009/0122741 A1 | 5/2009 | Chang et al. | |
| 2009/0122892 A1 | 5/2009 | Chang et al. | |
| 2009/0122893 A1 | 5/2009 | Chang et al. | |
| 2009/0122894 A1 | 5/2009 | Chang et al. | |
| 2009/0122908 A1 | 5/2009 | Chang et al. | |
| 2009/0122920 A1 | 5/2009 | Chang et al. | |
| 2009/0122922 A1 | 5/2009 | Chang et al. | |
| 2009/0122923 A1 | 5/2009 | Chang et al. | |
| 2009/0135936 A1 | 5/2009 | Chang et al. | |
| 2009/0147889 A1 | 6/2009 | Chang et al. | |

FOREIGN PATENT DOCUMENTS

| | | |
|---|---|---|
| CN | 1954605 | 10/2010 |
| KR | 20010111667 | 12/2001 |
| KR | 2002-89078 | 11/2002 |
| MX | PA03005163 | 9/2003 |
| MX | PA04002568 | 12/2004 |
| MX | PA/a/2006/008026 | 7/2006 |
| WO | 2005/071958 | 8/2005 |

OTHER PUBLICATIONS

KR Office Action dated Aug. 11, 2006 issued in KR 2005-39317.

Mexican Office Action issued Jun. 12, 2009 in MX Application No. PA/a/2006/013046.

Office Action (issuance date: Jul. 22, 2011) issued by the Mexican Patent Office for Mexican Patent Application No. MX/a/2009/009052.

Office Action (issuance date: Jul. 22, 2011) issued by the Mexican Patent Office for Mexican Patent Application No. MX/a/2009/009053.

Office Action (issuance date: Jul. 22, 2011) issued by the Mexican Patent Office for Mexican Patent Application No. MX/a/2009/009051.

Office Action (issuance date: Jul. 20, 2011) issued by the Mexican Patent Office for Mexican Patent Application No. MX/a/2009/009056.

Communication dated Oct. 9, 2012 issued by the State Intellectual Property Office of P.R. China in counterpart Chinese Patent Application No. 200910168915.2.

* cited by examiner

DIGITAL BROADCASTING TRANSMISSION/RECEPTION DEVICES CAPABLE OF IMPROVING A RECEIVING PERFORMANCE AND SIGNAL PROCESSING METHOD THEREOF

TECHNICAL FIELD

The present invention relates to a digital broadcasting transmitter and receiver, and more specifically, to a digital broadcasting transmitter for replacing and transmitting stuff bytes inserted in data stream with predefined known data in a dual stream to enhance reception performance and a signal processing method thereof, and a corresponding digital broadcasting receiver and a signal processing method thereof.

BACKGROUND ART

The Advanced Television Systems Committee Vestigial Sideband (ATSC VSB), U.S-oriented terrestrial waves digital broadcasting system, is a single carrier scheme and uses field synchronizing signal by 312 segment unit. Accordingly, reception performance is not good in poor channels, especially in a doppler fading channel.

FIG. 1 is a block diagram showing a conventional transmitter of the ATSC VSB. The digital broadcasting transmitter of FIG. 1 forms and transmits a dual stream by adding a robust data to a normal data of the existing ATSC VSB system according to 'ATSC Digital Television Standard (A/53B)' of Enhanced Vestigial Sideband (EVBS) system.

As shown in FIG. 1, the robust data in the digital broadcasting transmitter is processed by a robust data processor (11), and the robust data processor (11) has a Reed-Solomon (RS) encoder (11-1), a data interleaver (11-2) and a packet formatter (11-3). The packet formatter (11-3) has a packet identifier (PID) inserter (not shown) and a ½ or ¼ rate duplicator (not shown). Robust data processed by the robust data processor (11) is multiplexed with a normal data by a multiplexer (MUX) (12).

The data output in the multiplexer (12) is randomized through a randomizer (13) and passes through an RS encoder (14) and an interleaver (15) in the form of a concatenated code to correct errors generated by the channel. In addition, a symbol processor (16) performs enhanced coding for the robust data, a deinterleaver (17) deinterleaves it before reconstructing RS parity, and an RS parity deleting part (18) deletes RS parity to be compatible with the existing system. The data whose the RS parity is deleted is input to a VSB transmitter (19). The VSB transmitter (19) includes an RS encoder (19-1), a data interleaver (19-2), a Trellis encoder (19-3) and a multiplexer (19-4) according to the structure of a general VSB transmitter and performs RS encoding, data interleaving, 12 Trellis interleaved encoding, insertion of a synchronizing signal and a pilot, VSB modulation and up-convertor.

The above-mentioned conventional digital broadcasting transmitter transmits normal data and robust data in one channel as a dual stream scheme. The robust data is pre-processed by the robust data processor, in detail the pre-processing is performed by the RS encoder (11-1), the interleaver (11-2) and the packet formatter (11-3) with the PID inserter (not shown) and the duplicator (not shown) so that the Moving Picture Experts Group-2 transport stream (MPEG-2 TS) is generated.

The robust data pre-processed by the robust data processor (11) is multiplexed with the normal data by the multiplexer (MUX) (12) and is randomized by the randomizer (13) and the randomized data is outer-coded by the RS encoder (14) of an outer coder, and the outer-coded data is dispersed by the interleaver (15). In addition, the robust data is enhancedly coded by the symbol processor (16), and passes through the deinterleaver (17) for performing symbol-to-byte conversion and data interleaving for compatibility with the existing system and the parity delete (18).

Later, as performed in the existing VSB transmitter, RS encoding, data interleaving, 12 Trellis interleaved encoding, insertion of a synchronizing signal and a pilot, VSB modulation and so on are carried out.

FIG. 2 shows a data format of the data output by the multiplexer (12). In FIG. 2, the normal data and the robust data are arranged at certain intervals so that the normal signal and the robust signal after Trellis encoding are distributed at regular intervals.

The U.S-oriented terrestrial waves digital television system of FIG. 1 transmits in the dual stream by adding the robust data in the normal data of the existing ATSC VSB system, so the existing normal data and the robust data are transmitted altogether.

However, the U.S-oriented terrestrial waves digital television system of FIG. 1 has a problem that in spite of dual stream transmission with the robust data, poor transmission performance at multipath channels on transmitting the existing normal stream is not almost improved.

DISCLOSURE OF INVENTION

Technical Problem

Therefore, an aspect of the present invention is to provide a digital broadcasting transmitter for replacing and transmitting stuff bytes inserted in dual stream with known data to enhance transmission performance and a signal processing method thereof and a corresponding digital broadcasting receiver and a signal processing method thereof.

Technical Solution

To achieve an aspect of the present invention, a digital broadcasting transmitter includes a robust data pre-processor for processing a robust data to generate a robust data packet of a predetermined format; a TS stream generator for inputting a normal data packet, including stuff bytes in a certain location, and inserting the robust data packet at certain intervals among the normal data packets so that a dual TS stream of a certain format is generated; a randomizer for randomizing the TS stream output from the TS stream generator; a stuff byte replacing part for replacing the stuff bytes of the data output from the randomizer with a predetermined known data; a first RS encoder for performing RS encoding of the data output from the stuff byte replacing part; an interleaver for interleaving the data output from the first RS encoder; a symbol processor for coding the robust data among the data output from the interleaver; a first deinterleaver for deinterleaving the data output from the symbol processor; and a Trellis encoder for initializing memory at the beginning point of the known data among the data output from the first interleaver and performing Trellis encoding.

Preferably, the known data has a predefined certain pattern.

Additionally, the digital broadcasting transmitter further includes a second deinterleaver for deinterleaving the data output from the symbol processor; and a parity delete for deleting an RS parity in the data output from the second deinterleaver.

Further, the digital broadcasting transmitter further includes a third RS encoder for performing RS encoding of the data output from the parity delete; and a reinterleaver for interleaving the data output from the third RS encoder.

More preferably, the digital broadcasting transmitter further includes a RS output buffer for inputting and temporarily storing the known data from the beginning point among the data ouput from the third RS encoder.

Further, the RS output buffer inputs and stores the known data altered according to initializing of memory from the Trellis encoder.

Additionally, the digital broadcasting transmitter further includes a parity restructuring part for generating the altered parity by inputting the altered known data from the RS output buffer and performing RS encoding, and outputting the altered parity to the Trellis encoder so as to replace the parity added by the third RS encoder.

Further, the stuff bytes are inserted in an adaptation field of the normal data packet.

Additionally, the normal data packet includes information on length of the inserted stuff bytes at a certain location.

Meanwhile, a method for signal processing for a digital broadcasting transmitter according to the present invention includes a robust data preprocessing step of processing the robust data to generate a robust data packet of a certain format; a TS stream generating step of being input with a normal data packet where stuff bytes are inserted at a certain location and inserting the robust data packet at certain intervals in the normal data packet to generate a dual TS stream of a predetermined format; a randomizing step of randomizing the TS stream generated in the TS stream generating step; a stuff byte replacing step of replacing the stuff bytes in the data output from the randomizing step with a predetermined known data; a first RS encoding step of performing RS encoding of the data output from the stuff byte replacing step; an interleaving step of interleaving the data output from the first RS encoding step; a symbol processing step of coding the robust data of the data output from the interleaving step; a first deinterleaving step of deinterleaving the data output from the symbol processing step; and a Trellis encoding step of initializing memory at the beginning point of the known data of the data output from the first deinterleaving step and performing Trellis encoding.

Additionally, A digital broadcasting transmitter according to another embodiment includes a TS stream generator for receiving a normal data packet and a robust data packet respectively having stuff bytes at a certain location and inserting the robust data packet at certain intervals among the normal data packet to generate dual TS stream of a certain format; a randomizer for randomizing the TS stream output from the TS stream generator; a stuff byte replacing part for replacing the stuff bytes of the data output in the randomizer with a predetermined known data; a first RS encoder for performing RS encoding of the data output from the stuff byte replacing part; an interleaver for interleaving the data output in the first RS encoder; a symbol processor for performing coding of the robust data of the data output in the interleaver; a first deinterleaver for deinterleaving the data output in the symbol processor; and a Trellis encoder for initializing memory of the known data of the data output in the deinterleaver at the beginning point, and performing Trellis encoding.

Preferably, the stuff bytes are inserted in adaptation field of the normal data packet and the robust data packet.

Further, the normal data packet and the robust data packet include information on length of the inserted stuff bytes at a certain location.

Additionally, a method for signal processing for a digital broadcasting transmitter includes a TS stream generating step of receiving normal data packet and robust data packet respectively having stuff bytes at a certain location and inserting the robust data packet among the normal data packet at certain intervals to generate dual TS stream of a certain format; a randomizing step of randomizing the TS stream generated in the TS stream generating step; a stuff byte replacing step of replacing the stuff bytes of data output in the randomizing step with a predetermined known data; a first RS encoding step of performing the RS encoding of data output in the stuff byte replacing step; an interleaving step of interleaving data output in the first RS encoding step; a symbol processing step of performing coding the robust data of data output in the interleaving step; a first deinterleaving step of deinterleaving data output in the symbol processing step; and a Trellis encoding step of initializing memory of the known data of data output in the first deinterleaving step at the beginning point and performing Trellis encoding.

Meanwhile, a digital broadcasting receiver according to the present invention includes a demodulator for receiving and demodulating signal encoded by inserting a predetermined known data in a certain location of dual stream, where stuff bytes are inserted in the certain location, from the digital broadcasting receiver; a known data output part for detecting a location of the known data from the demodulated signal and outputting the known data; an equalizer for equalizing the demodulated signal; a Viterbi decoder for correcting errors of the equalized signal and decoding using the detected known data; a deinterleaver for deinterleaving data output in the Viterbi decoder; a derandomizer for derandomizing data output in the deinterleaver; a de-multiplexer for separating robust data and normal data in data output in the de-randomizer; and a robust data processor for processing and restructuring the robust data.

Preferably, the known data output part includes a known symbol detector for detecting information on the certain location where the known data is inserted in received signal; a segment flag generator for generating data frame including one or more segment indicating the location with a predetermined identification flag; a Trellis interleaver for encoding the data frame as encoding in the digital broadcasting transmitter; and a known data extractor for inserting and outputting the known data at the location where the identification flag is indicated in the interleaved data frame.

Further, the known data output part outputs the detected known data to the demodulator, and the demodulator performs demodulation using the known data.

Additionally, a method for signal processing for a digital broadcasting receiver according to the present invention includes a demodulating step of receiving and demodulating encoded signal by inserting a predetermined known data in a certain location of dual stream, where stuff bytes are inserted in the certain location, from a digital broadcasting transmitter; a known data outputting step of detecting a location of the known data from the demodulated signal and outputting the known data; a equalizing step of equalizing the demodulated signal; a decoding step of correcting errors of the modulated signal using the detected known data and decoding; a deinterleaving step of deinterleaving data output in the decoding step; a derandomizing step of derandomizing data output in the deinterleaving step; a demultiplexing step of separating robust data and normal data from data output in the derandomizing step; and a robust data processing step of processing and restructuring the robust data.

Advantageous Effects

According to the present invention, a digital broadcasting transmitter generates and inserts stuff bytes in a MPEG-2 TS packet, the inserted stuff bytes are replaced with known data and transmitted to a digital broadcasting receiver, and a digital broadcasting receiver detects and uses the known data. Accordingly, there are effects of compatibility with the existing digital broadcasting system, lower complexity of hardware, and enhanced digital broadcasting reception performance in poor multipath channels.

BEST MODE FOR CARRYING OUT THE INVENTION

Hereinafter, the present invention will be described in detail with reference to the accompanying drawings.

Figure 5:
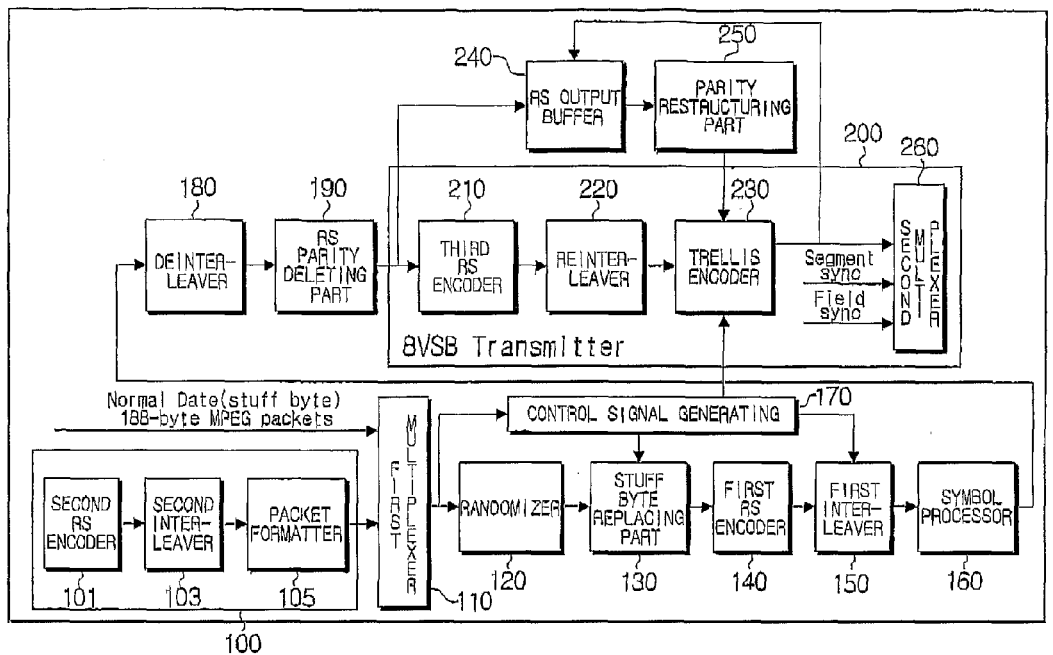
FIG. 5 is a block diagram of a digital broadcasting transmitter according to the present invention.

FIG. 5 is a block diagram of a digital broadcasting transmitter according to the present invention. The digital broadcasting transmitter of FIG. 5 has the structure to improve the EVSB system that LG (Zenith)/ATI proposed. In detail, stuff bytes are added in a MPEG-2 packet of normal data, the added stuff bytes are replaced with known data in the digital broadcasting transmitter, and then are transmitted. Then, the known data is detected in a corresponding digital broadcasting receiver and is used to compensate distortion by a channel.

In FIG. 5, the digital broadcasting transmitter has a first multiplexer (110) for multiplexing normal data and robust data output from a robust data pre-processor (100), a randomizer (120) for randomizing the multiplexed data, a stuff byte replacing part (130) for replacing the stuff bytes, inserted in the normal data or robust data of the randomized data, with a particular sequence, a first RS encoder (140) for constructing the data output from the stuff byte replacing part (130) in the form of concatenated code to correct errors by a channel, a first interleaver (150) for interleaving data, a symbol processor (150) a symbol processor (160) for enhancedly coding the robust data in the interleaved data, a control signal generator (170), de-interleaver (180) for de-interleaving the enhancedly coded data to be comparable with the existing system and a RS parity deleting part (190) for deleting an RS parity. The digital broadcasting transmitter employs the EVSB system and is constructed to be compatible with the existing system.

In addition, the digital broadcasting transmitter of FIG. 5 has a third RS encoder (210) for carrying out a VSB transmitting channel coding, a reinterleaver (220) for interleaving data again, and a Trellis encoder (230) for performing ⅔ rate Trellis encoding. The Trellis encoder (230) carries out the process to initialize the stuff bytes.

The robust data pre-processor (100) has a second RS encoder (101) for performing RS-encoding of a robust stream, a second interleaver (103) for interleaving the RS-encoded robust stream, and a packet formatter (305) for formatting the interleaved robust stream in a certain format.

That is, the robust data pre-processor (100) inserts PID in the RS-encoded robust stream through the packet formatter (305) and doubly duplicates it. Then, the robust data pre-processor (100) outputs robust MPEG packets as formatted to insert among the normal MPEG packets at certain intervals.

Figure 3:
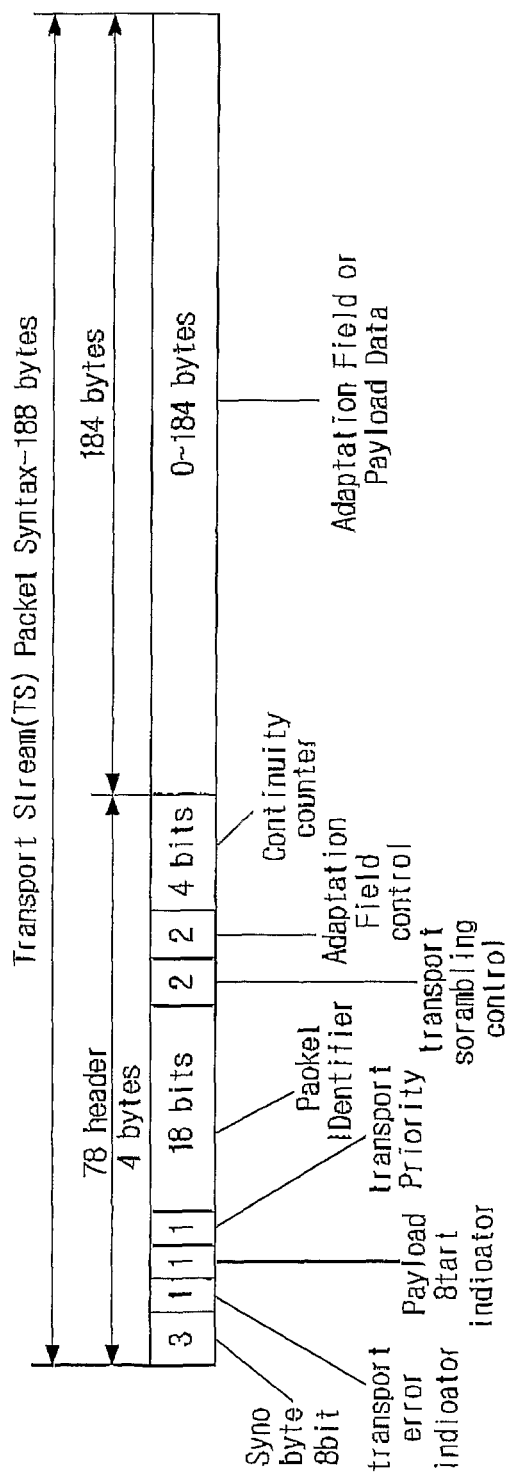
FIG. 3 is a view showing a frame structure of a TS packet.
Figure 4:
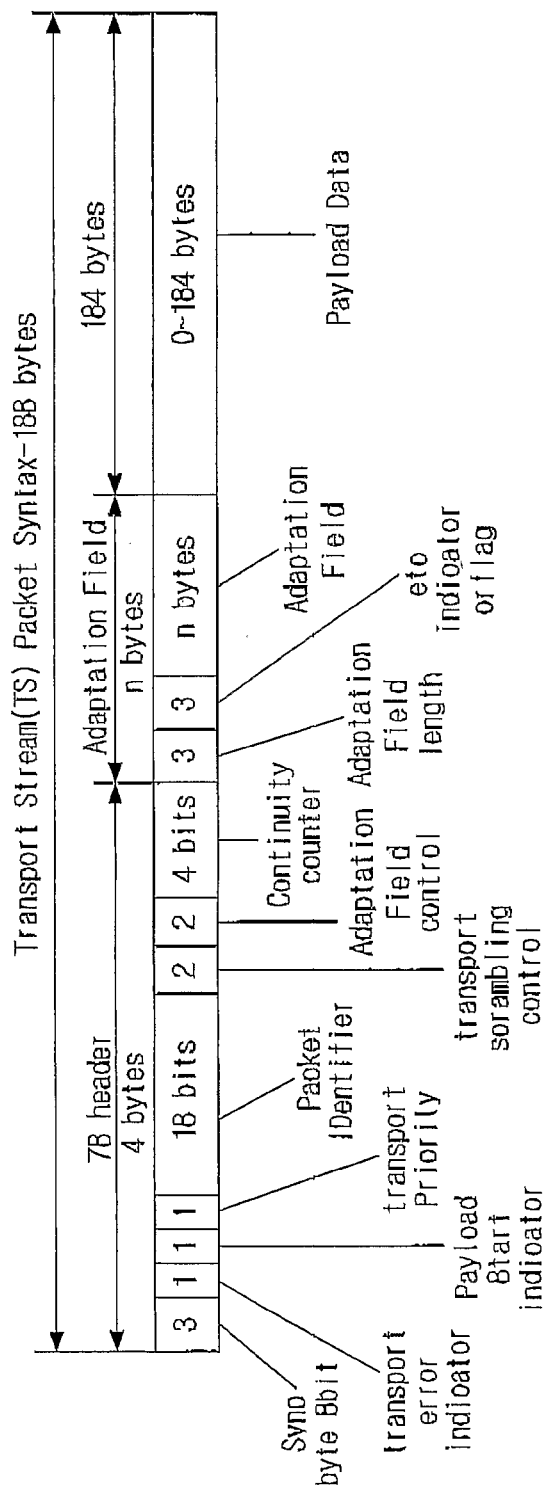
FIG. 4 is a view showing a frame structure of a TS packet including stuff bytes according to the present invention.

Meanwhile, the normal data packets or robust data packets to be input to the first multiplexer (110) according to the present invention include the stuff bytes. FIG. 3 is a view showing a frame structure of a general TS stream packet. FIG. 4 is a view showing a frame structure of a MPEG-2 TS stream packet including adaptation field with stuff bytes according to the present invention.

In FIG. 4, a MPEG-2 packet of 188 bytes consists of information signal (MPEG-2 header) of 4 bytes including MPEG synchronizing signal, adaptation field length information of 1 byte, other information of 1 byte, adaptation field data with stuff bytes of n bytes, and ES data of '188−(4+2+n)' bytes.

As shown in FIG. 3, a general TS stream packet frame consists of the MPEG-2 header and the adaptation field or the ES data. The normal data packet or robust data packet according to the present invention, as shown in FIG. 4, has structure that stuff bytes are inserted in the adaptation field so that TS stream includes the adaptation field. Such MPEG-2 TS packet of the normal data or robust data is input to the first multiplexer (110).

The first multiplexer (110) multiplexes the above-mentioned normal data or robust data output from the robust data pre-processor (100), and the randomizer (120) randomizes the multiplexed data.

The stuff byte replacing part (130) replaces stuff bytes, inserted in the normal data or robust data of the randomized data, with, for example, a particular sequence generated by a particular sequence generator (not shown) to output them. The particular sequence is data having predefined pattern that the transmitter and the receiver have already known each other, which is hereinafter referred to as known data.

Figure 6:
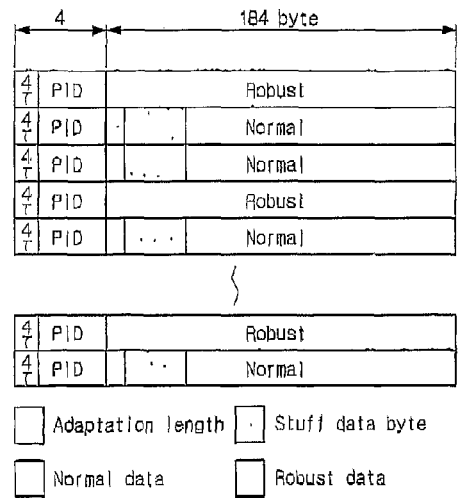
FIG. 6 and FIG. 7 are views showing a format of data output from a randomizer of FIG. 5, FIG. 8 and FIG. 9 are views showing a format of data output from an interleaver of FIG. 5, FIG. 10 and FIG. 11 are views showing a format of data output from a Trellis encoder of FIG. 5, FIG. 12 and FIG. 13 are views showing a format of data which parity is restructured according to Trellis initialization of FIG. 5.

FIG. 6 shows a data format after replacing stuff bytes of n bytes in a normal data packet with the particular sequence data in outputting from the randomizer (120). In FIG. 6, normal data packets and robust data packets are arranged at certain intervals and known data instead of stuff bytes are inserted in the adaptation fields of the normal data packets.

Figure 7:
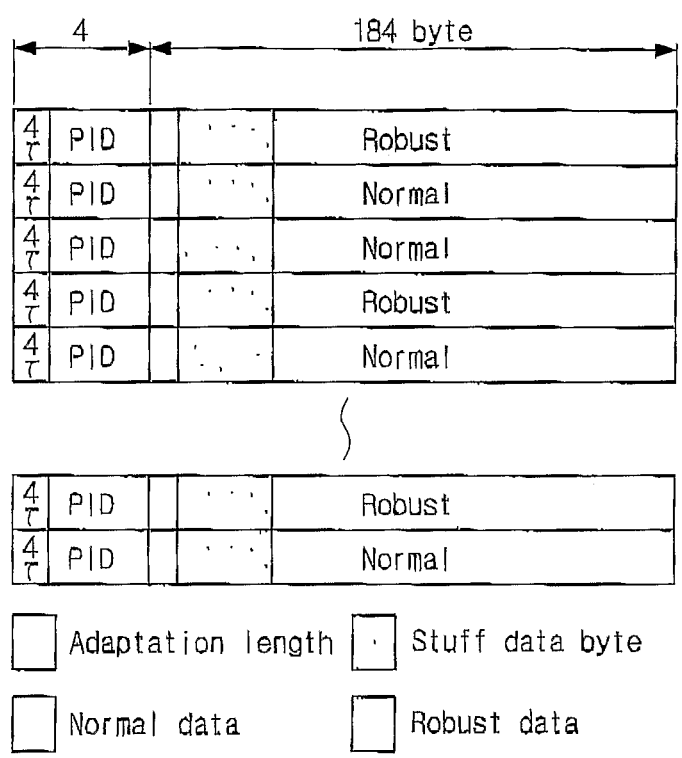

Further, FIG. 7, when stuff bytes are inserted in normal data packets and robust data packets, respectively, to be input to the randomizer (120), shows a data format after replacing stuff bytes of n bytes in normal data packets and robust data packets with the particular sequence data in outputting from the randomizer (120). In FIG. 7, normal data packets and robust data packets are arranged at certain intervals and known data instead of stuff bytes are inserted in the adaptation fields of the normal data packets and robust data packets.

In addition, as described above, the header of MPEG-2 packet data output from the randomizer (120) includes the first byte of a synchronizing signal and 3 bytes of packet identity (PID). The first 2 bytes of adaptation field of certain bytes include adaptation field length information. In other words, the first 2 bytes of the adaptation field have information on length of stuff bytes inserted in the adaptation field, that is, length of known data. As the beginning location of the known data in a packet is fixed, the receiver can know the information on location and length, that is, quantity of the known data according to the information inserted in the first 2 bytes of the adaptation field.

The first RS encoder (140) encodes the data output from the stuff byte replacing part (130), and performs outer coding in the form of concatenated code to correct errors generated by a channel.

The first interleaver (150) interleaves the data output from the first RS encoder (140). The symbol processor (160) performs enhanced coding of the robust data in the interleaved data. To be compatible with the existing system, the de-interleaver (180) deinterleaves and the RS parity deleting part (190) deletes parity in enhanced-coded data.

Figure 8:
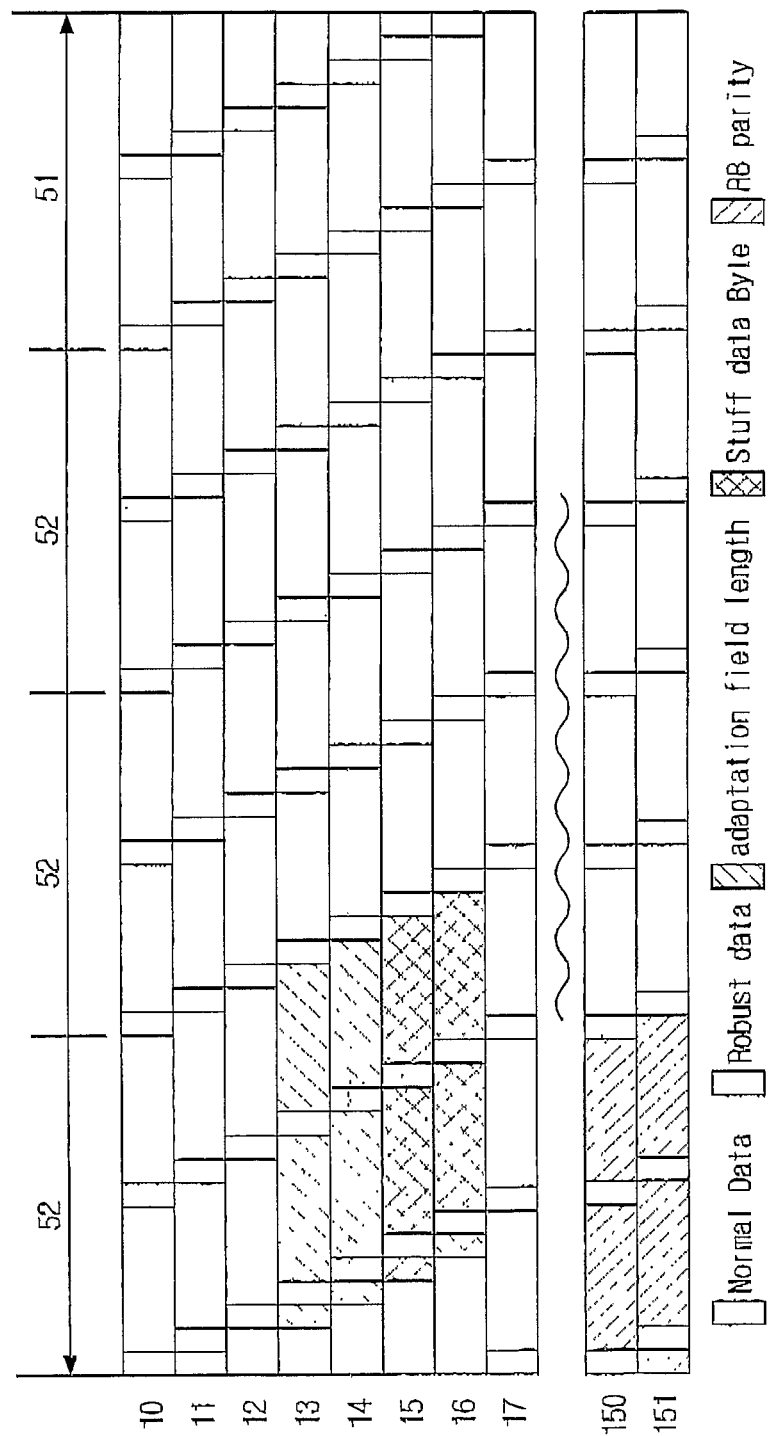
Figure 9:
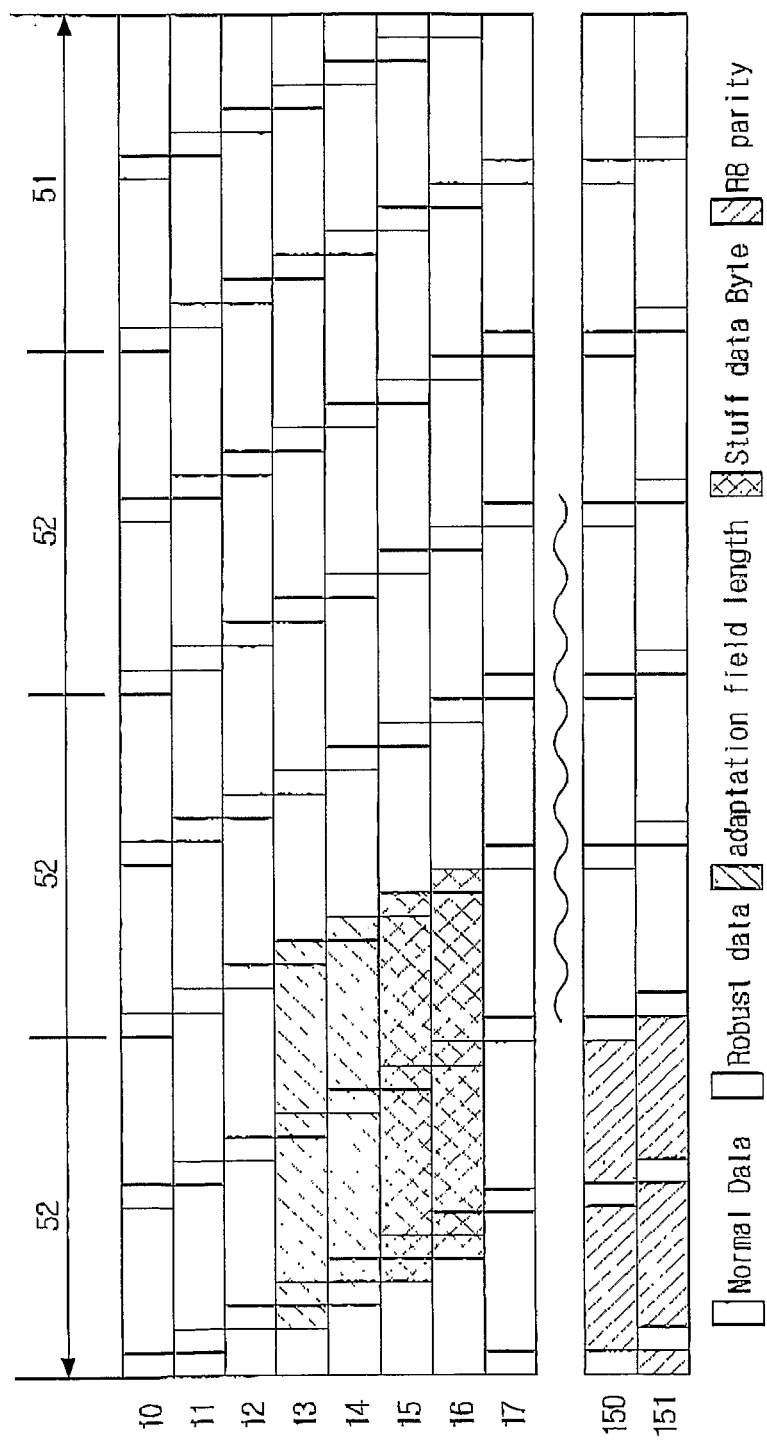
Figure 10:
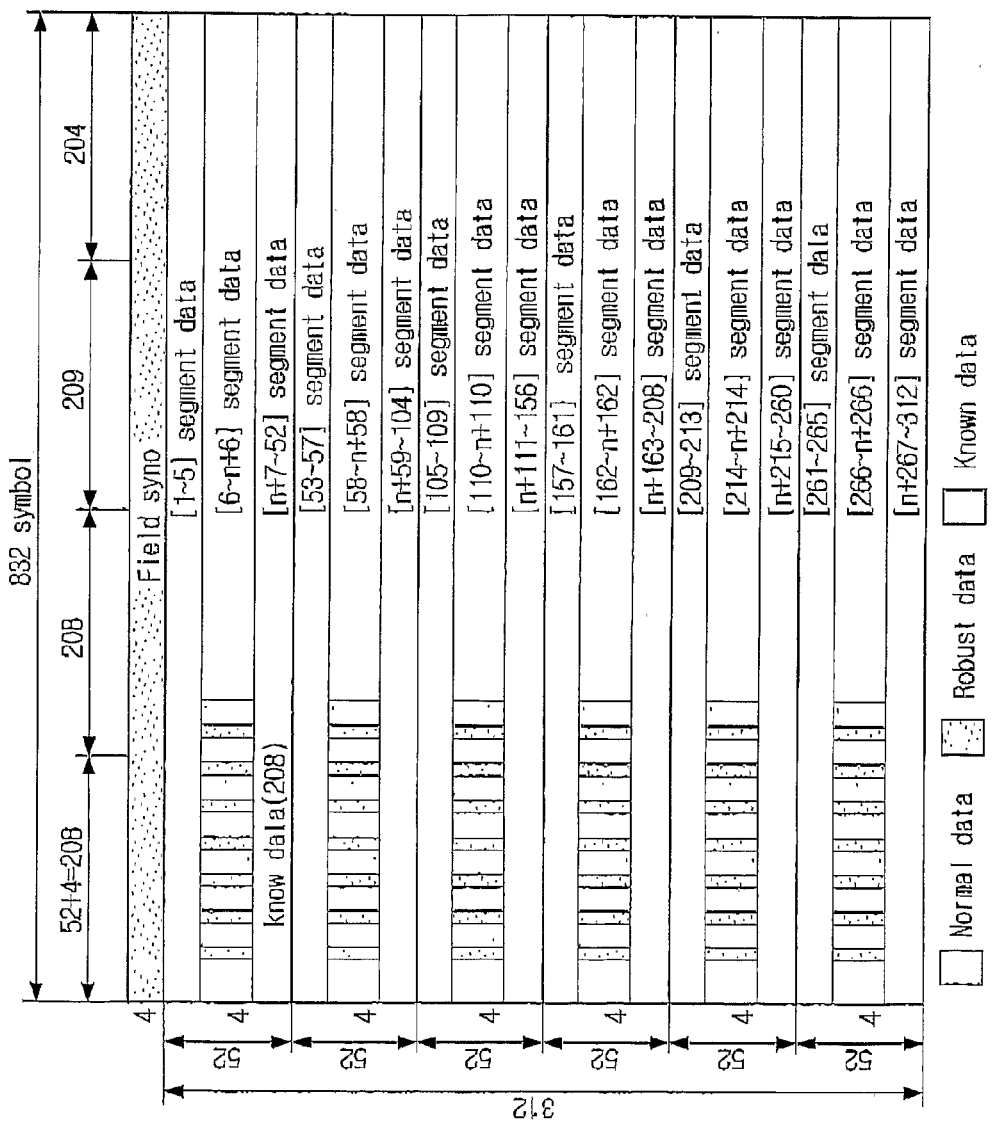
Figure 11:
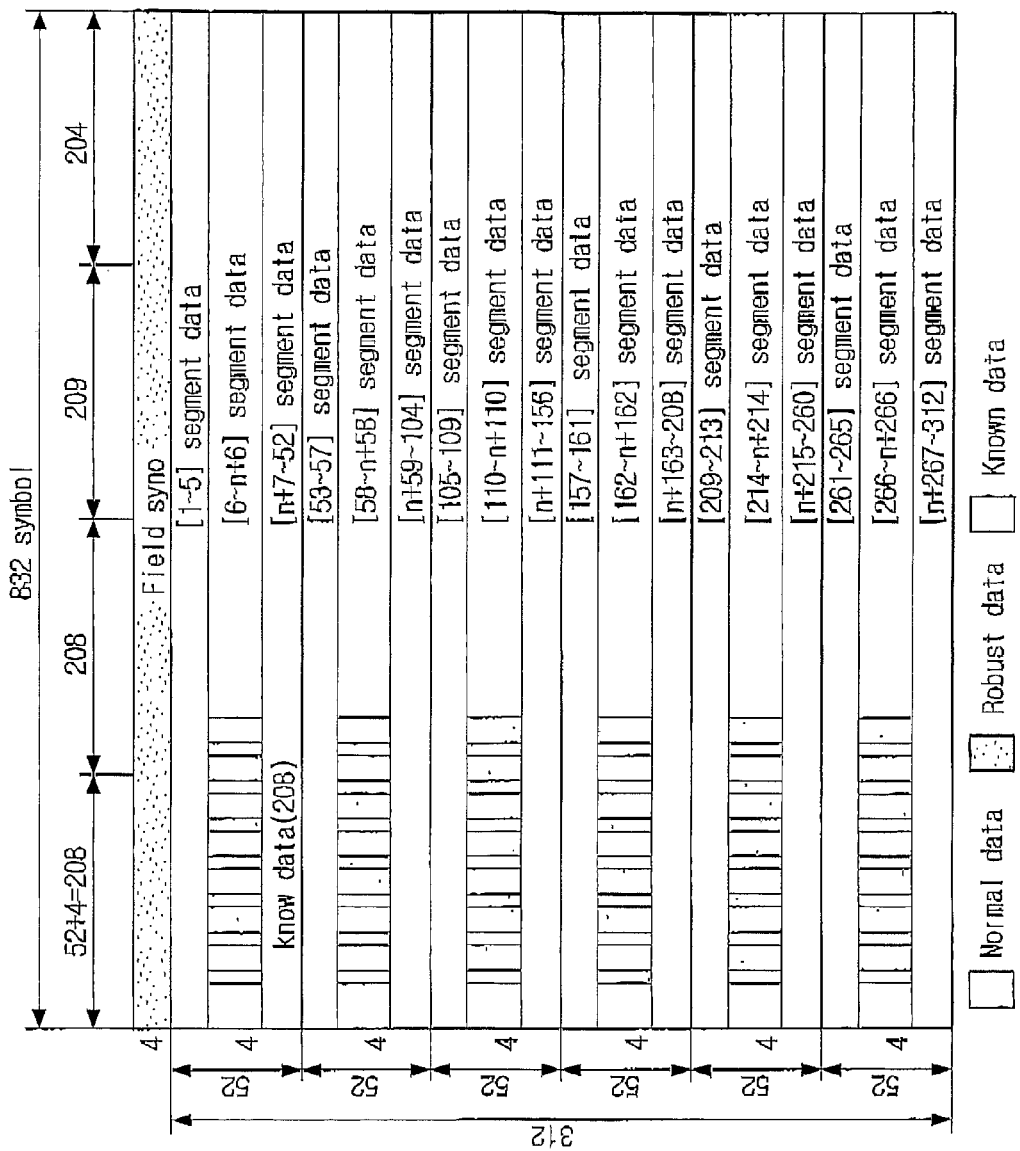

FIG. 8 and FIG. 9 show a data format after interleaving data by the first interleaver (150). MPEG-2 packets of FIG. 6 and FIG. 7 are dispersed in 52 units by the first interleaver (150), as those in FIG. 8 and FIG. 9. Data with the same byte location in MPEG-2 packet construct the same column, as shown FIG. 8 after interleaving. In addition, the data format output from the Trellis encoder (230) after 12 symbol interleaving is shown in FIG. 10 and FIG. 11. That is, data located in the same byte of MPEG-2 packets construct almost one data segment, as shown in FIG. 10 and FIG. 11, after Trellis encoding. Therefore, if stuff bytes are consecutively added in certain location of MPEG-2 packet and randomized, and the stuff bytes are replaced with a particular sequence, with Trellis encoding, the stuff bytes inserted in the same byte location form one data segment, which is detected and used in the digital broadcasting receiver as the known data to improve reception performance.

The control signal generator (170) detects information on the adaptation field length, and generates and outputs flag signal indicating a location of stuff bytes or known symbol sequence data.

Furthermore, to perform a VSB transmitting channel coding, the third RS encoder (210) performs RS encoding, the reinterleaver (220) interleaves data again, and the Trellis encoder (230) performs ⅔ rate Trellis encoding.

An RS output buffer (240) and a parity restructuring part (250) restructure parity of the known data which is altered according to the initialization of the Trellis encoder (230) and perform the VSB transmitting channel coding with the Trellis encoder (230).

The RS output buffer (240) outputs the known data from the data without RS parity which is output from the RS parity deleting part (190) from the beginning, and temporarily stores the output known data. Then, when the known data is Trellis-encoded in the Trellis encoder (230) according to the initialization, the RS output buffer (240) receives the known data altered according to the initialization from the Trellis encoder (230), replaces the previously buffered known data with it and stores the altered known data, and inputs the altered known data to the parity restructuring part (250) to regenerate parity.

The parity restructuring part (250) receives the known data altered according to the initialization, regenerates parity according to the altered data, and inputs it to the trellis encoder (230) so that the previous parity is replaced with the new parity.

The Trellis encoder (230) converts the data output from the reinterleaver (220) into symbol and performs symbol mapping through ⅔ rate Trellis encoding. Furthermore, as above-mentioned, the Trellis encoder (230) performs 12 Trellis encoder initialization at beginning location of the known data, that is, known symbol sequence so that value of memory element of the encoder becomes a particular value, for example, '00'. The Trellis encoder (230) initializes a value temporarily stored in memory element itself at beginning location of the known data and carries out Trellis encoding of the known data.

Therefore, the data packet output from the Trellis encoder (230) to a multiplexer (260) includes the known data altered according to the memory element initialization of the Trellis encoder (230), and has data format added with parity according to RS encoding of the altered known data.

FIG. 10 and FIG. 11 show data formats output from the Trellis encoder (230), which are processed with 12 symbol interleaving. One field includes six convolutional interleavers so that six sequences including stuff bytes appear. In other words, if TS stream has stuff bytes of 10 bytes, known symbol sequences of '0*6=60' are generated in one field.

Figure 12:
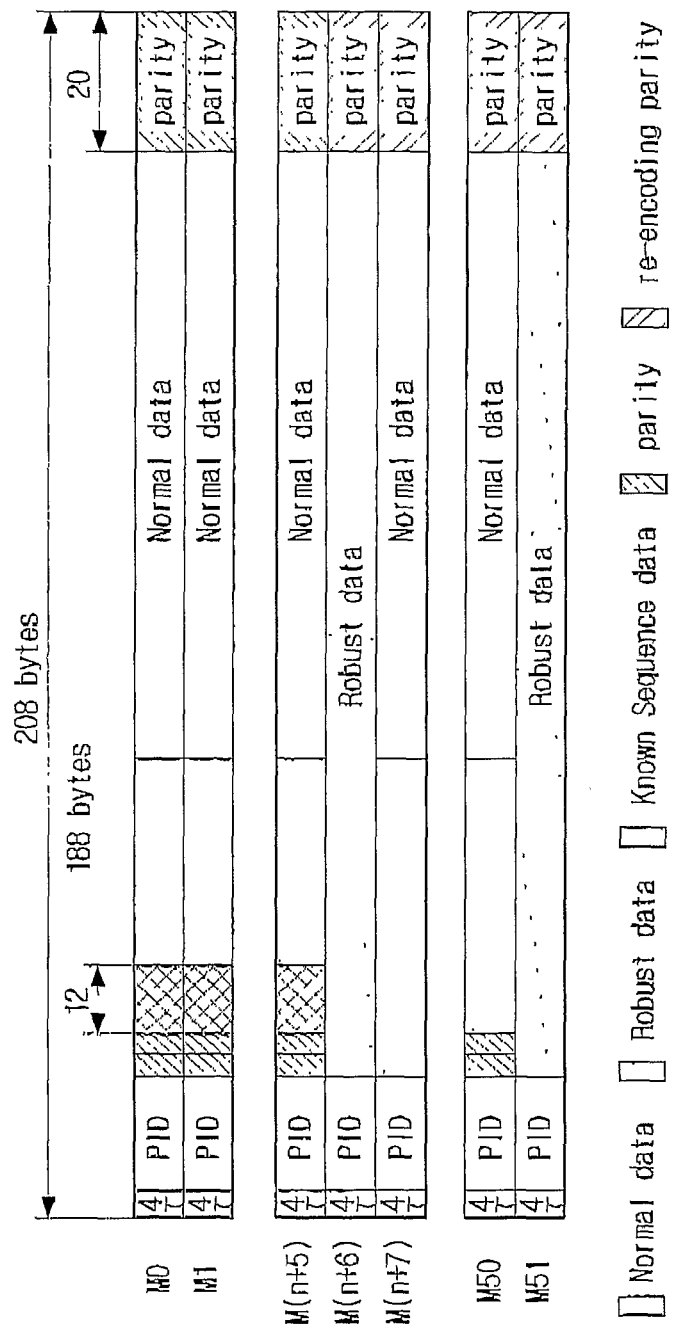
Figure 13:
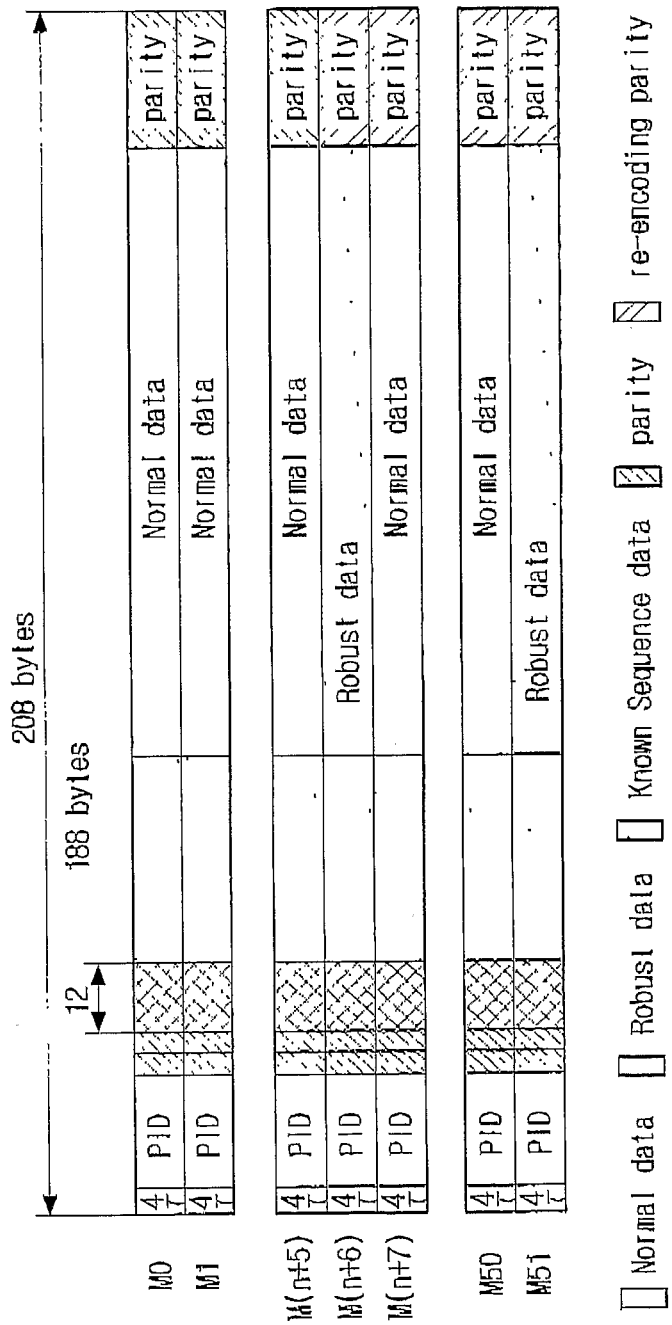

FIG. 12 and FIG. 13 show a data format after RS re-encoding and parity restructuring by the parity restructuring part (250) of FIG. 5. That is, if the Trellis encoder (230) is initialized at beginning point of sequence of known symbol, the parity restructuring part (250) alters output parity of the third RS encoder (210) according to the value of initialization and the altered parity is input to the Trellis encoder (230). Accordingly, the Trellis encoder (230) updates the altered parity and carries out the Trellis encoding so that there will be no problem when an RS decoder of the digital broadcasting receiver decodes.

In other words, initialization of the Trellis encoder (230) is performed in order for Trellis encoded data to form particular sequence during known symbol sequence section. Then, in order to alter RS parity corresponding to known symbol sequence altered according to the initialization, RS encoding of the altered known symbol sequence is performed again so that parity is altered. The existing parity is replaced with the altered parity so that the data format like FIG. 12 and FIG. 13 is generated.

Figure 1:
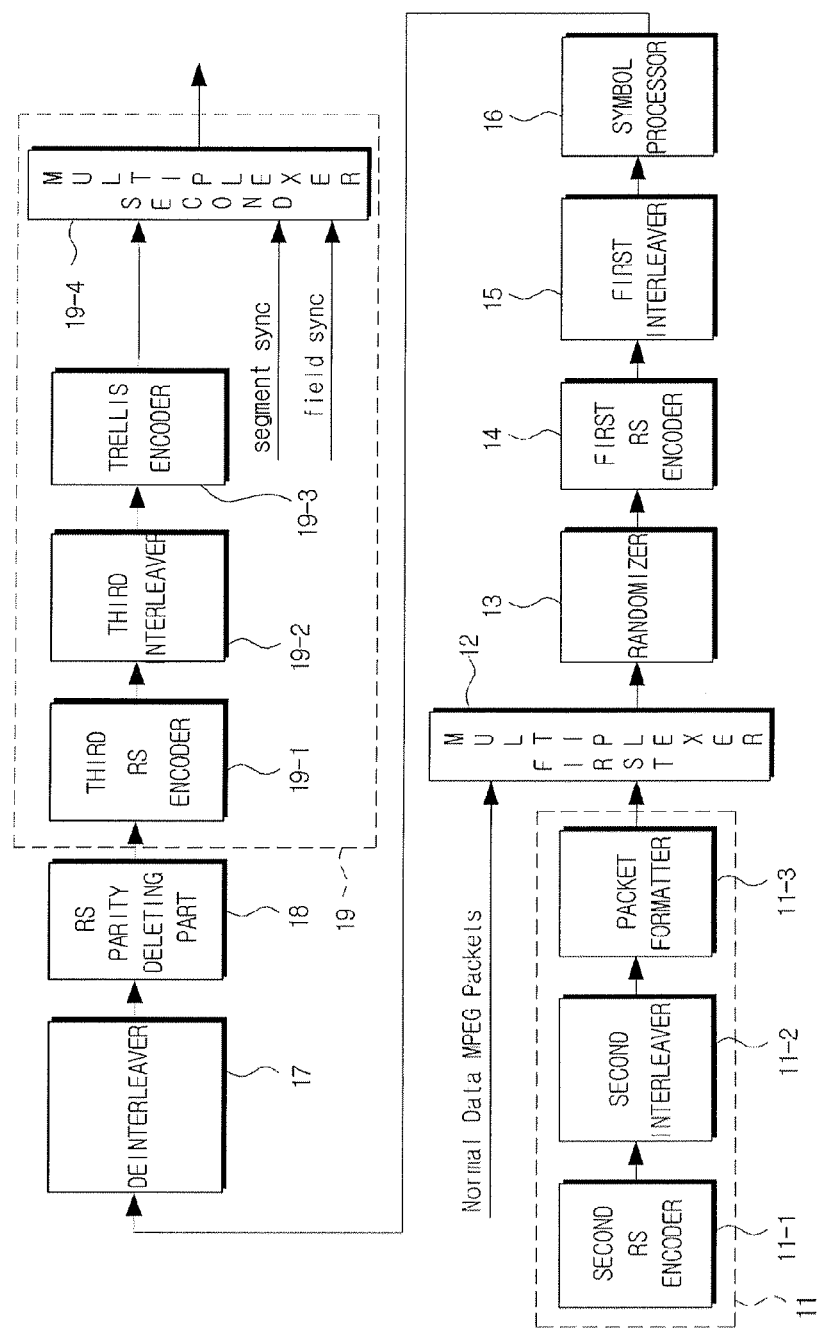
FIG. 1 is a block diagram of a transmitter of a conventional U.S-oriented terrestrial waves digital broadcasting (ATSC VSB) system.
Figure 2:
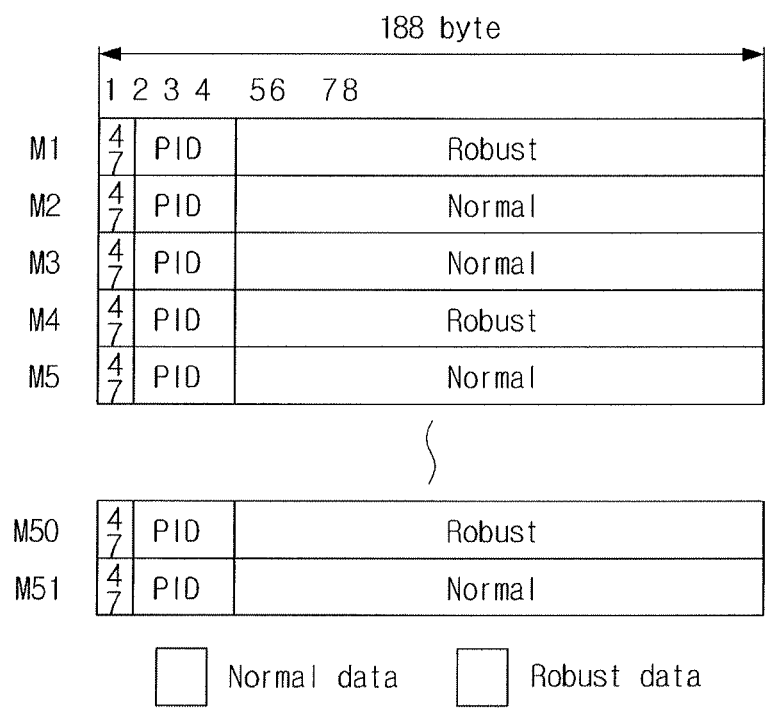
FIG. 2 is a view showing a format of ATSC VSB data.

To the data which is encoded via the Trellis encoder (230), the RS output buffer (240) and the parity restructuring part (250), and mapped into symbol, field sync signal and segment sync signal are inserted by the second multiplexer (260) like the data format of FIG. 2. DC offset is added in a transmitter end to generate pilot so that VSB modulation is performed, and the data is converted into RF and transmitted.

Figure 14:
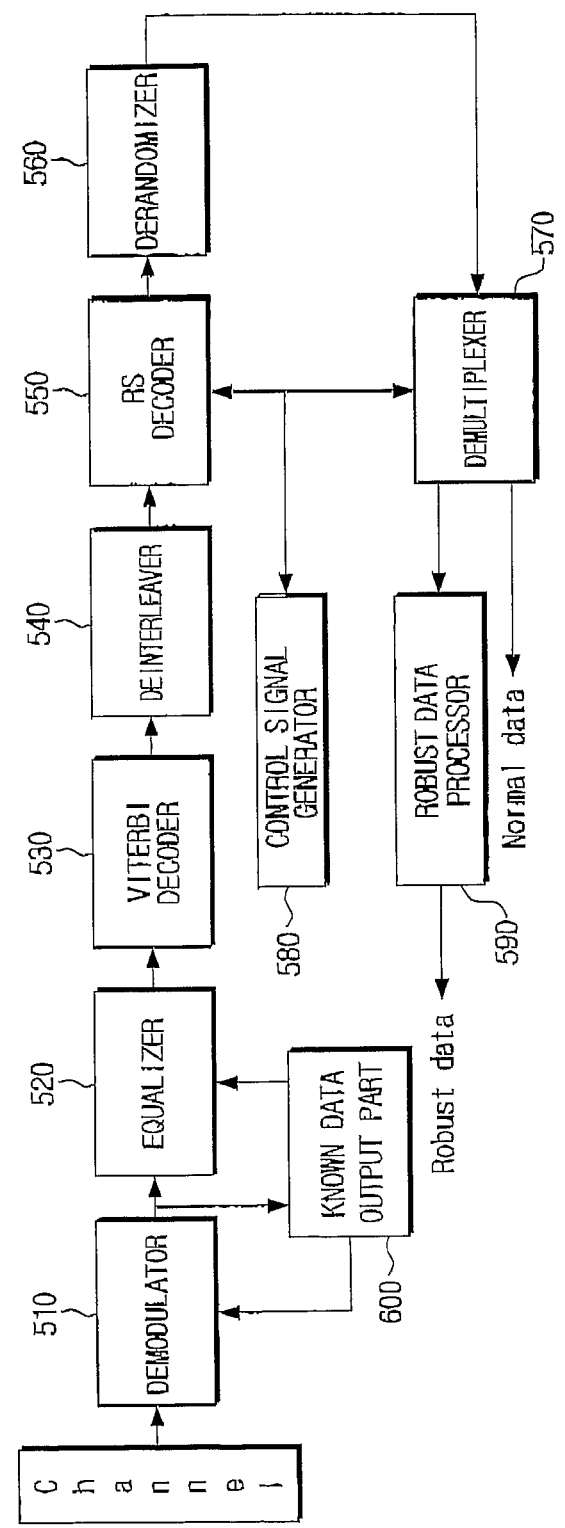
FIG. 14 is a block diagram of a digital broadcasting transmitter according to the present invention.

FIG. 14 is a block diagram of a digital broadcasting receiver corresponding to the digital broadcasting transmitter of FIG. 5 according to the present invention. If the received signal includes normal, robust and stuff bytes, the digital broadcasting receiver has elements for decoding.

The digital broadcasting receiver of FIG. 14 includes a demodulator (510) for lowering RF signal to baseband and demodulating it, an equalizer (520) for deleting inter-symbol interference, a Viterbi decoder or Trellis decoder (530), a deinterleaver (540), an RS encoder (550), an derandomizer (560), a demultiplexer (570) for separating normal data and robust data, a control signal generator (580) for generating control signal to control dual stream, a robust data processor (590), and a known data output part (600) for detecting location of stuff bytes and outputting known data.

The Viterbi decoder (530), the deinterleaver (540), the RS encoder (550), and the inverse randomizer (560) correct error from the equalized signal and perform decoding.

The demodulator (510) converts RF signal received via channel into baseband signal through tuner/IF (not shown), detects sync of the converted baseband signal and performs demodulation. The equalizer (520) compensates multipath channel distortion of the demodulated signal.

Meanwhile, the known data output part (600) detects information on stuff byte length inserted in the reserved part of field sync data segment section or the first 2 bytes of adaptation field to acquire location information on known symbol, and outputs known data from the acquired information on location.

Figure 15:
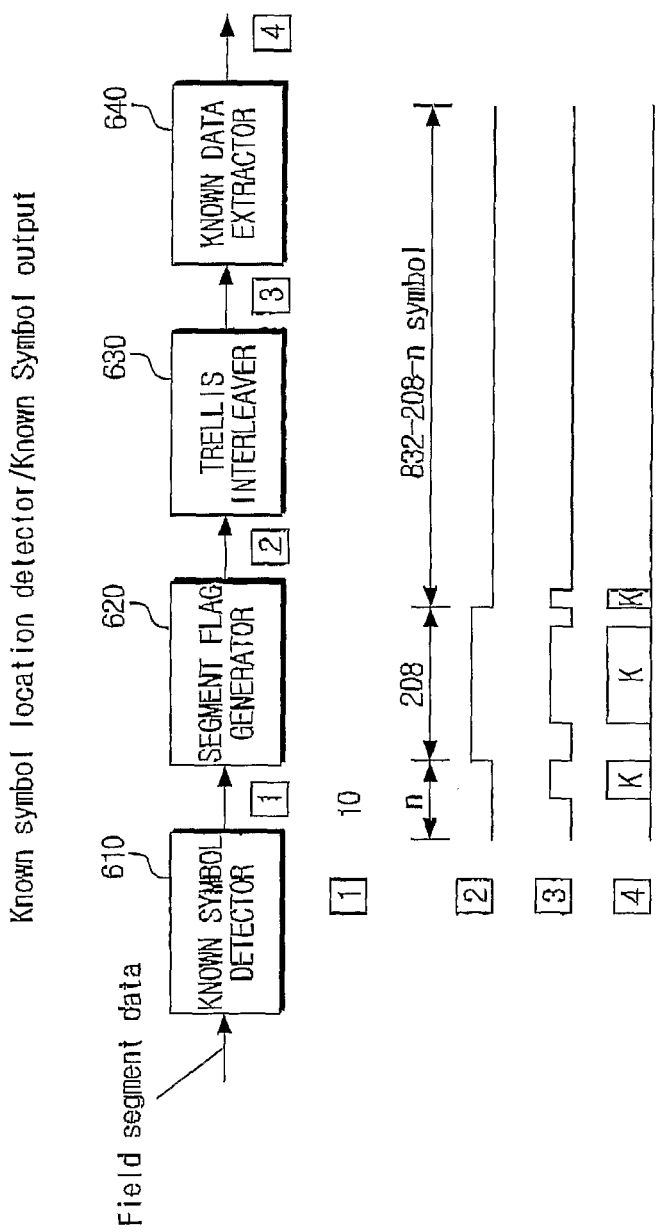
FIG. 15 is a view provided to describe a known data output part of FIG. 10.

FIG. 15 shows the known data output part (600) for detecting the known data in the digital broadcasting receiver.

The known data output part (600) includes a known symbol detector (610), a segment flag generator (620), a Trellis interleaver (630), and a known data extractor (640).

If the information on the quantity (the number) of stuff bytes is inserted in control information bit, including information on adaptation field length of data header, or in the reserved part of field sync data segment section, the known symbol detector (610) of the known data output part (600) of the digital broadcasting receiver detects the information on the quantity of known data. According to the detected information, the segment flag generator (620) and the Trellis interleaver (630) acquire information on the location and the number of known symbol. From the acquired information on the location and the number of known, the known data extractor (640) ouputs the known data so that receiving performance of the digital broadcasting receiver is improved. As the location of stuff bytes is fixed all the time, if quantity of stuff bytes is detected, the segment flag generator (620) and the Trellis interleaver (630) can be implemented using a counter and a control logic.

That is, the known symbol detector (610) extracts information of known data location from control information bit including information on adaptation field length of the demodulated data header. The information on known data location includes the information on known data length. As the known data location is preset, the location and number of known symbols according to encoding of known data can be acquired by knowing the length.

According to the location and number of the known symbol, the segment flag generator (620) marks a predetermined flag of length corresponding to the number at the corresponding location and generates at least one segment and a MPEG-2 transmission frame including the segment.

The Trellis interleaver (630) encodes transmission frame generated in the segment flag generator (620) like interleaving in the digital broadcasting transmitter.

The known data extractor (640) inserts predefined known data at the location for known symbol which is identified by the flag in transmission frame encoded and output from the Trellis interleaver (630), and outputs the known data-inserted frame.

Meanwhile, errors of signal equalized by the equalizer (520) are corrected through the Viterbi decoder (530) and the signal is decoded to symbol data. The deinterleaver (540) rearranges data dispersed by the first interleaver (150) of the transmitter in FIG. 5. Errors of the deinterleaved data are corrected through the RS encoder (550). The control signal generator (580) generates control signal to process normal data and robust data. The corrected data through the RS encoder (550) is derandomized through the derandomizer (560). The derandomized data separates into normal data and robust data through the demultiplexer (570) and the robust data is processed by the robust data processor (590).

As above described, stuff bytes are generated and inserted in MPEG-2 TS packet, the inserted stuff bytes are replaced with known data and transmitted from the digital broadcasting transmitter, and then the digital broadcasting receiver detects and use the known data. Accordingly, receiving performance of the digital broadcasting receiver such as sync acquiring and equalizing performance can be improved.

The invention claimed is:

1. A digital broadcasting transmitter, comprising:
a robust data pre-processor to process robust data to generate a robust data packet of a predetermined format;
a Transport Stream (TS) stream generator to receive a normal data packet, including stuff bytes inserted in a certain location, and to insert the robust data packet at certain intervals to the normal data packets so that a dual TS stream of a certain format is generated;
a randomizer to randomize the TS stream output from the TS stream generator;
a stuff byte replacing part to replace the stuff bytes of the data output from the randomizer with a predetermined known data;
a first Reed Solomon (RS) encoder to perform RS encoding of the data output from the stuff byte replacing part;
an interleaver to interleave the data output from the first RS encoder;
a symbol processor to code the robust data among the data output from the interleaver;
a deinterleaver to deintervleave the data output from the symbol processor;
a Trellis encoder to initialize memory at a beginning point of the known data among the data output from the first interleaver and to perform Trellis encoding;
a parity deleting part to delete an RS parity from the data output from the deinterleaver; a second RS encoder to perform RS encoding of the data output from the parity deleting part;
a reinterleaver to interleave the data output from the second RS encoder; and
an RS output buffer to receive the known data from the beginning point of the data output from the second RS encoder and to temporarily store the known data.

2. The digital broadcasting transmitter as claimed in claim 1, wherein the known data has a predefined certain pattern.

3. The digital broadcasting transmitter as claimed in claim 1, wherein the RS output buffer receives and stores the known data altered according to initializing of memory from the Trellis encoder.

4. The digital broadcasting transmitter as claimed in claim 3, further comprising:
a parity restructuring part to receive the altered known data from the RS output buffer, to perform RS encoding to generate an altered parity, to output the altered parity to the Trellis encoder, and to replace the parity added by the second RS encoder.

5. The digital broadcasting transmitter as claimed in claim 1, wherein the stuff bytes are inserted in an adaptation field of the normal data packet.

6. The digital broadcasting transmitter as claimed in claim 1, wherein the normal data packet includes information on length of the inserted stuff bytes being inserted at a certain location.

7. A method of signal processing for a digital broadcasting transmitter, comprising:
processing robust data to generate a robust data packet of a certain format;
receiving a normal data packet where stuff bytes are inserted at a certain location and inserting the robust data packet at certain intervals in the normal data packet to generate a dual Transport Stream (TS) stream of a predetermined format;
randomizing the generated TS stream;
replacing the stuff bytes in the data output from the randomizing of the TS stream with a predetermined known data;

performing first Reed Solomon (RS) encoding of the data output from the replacing of the stuff bytes;

interleaving the data output from the first RS encoding;

coding the robust data of the data output from the interleaving;

deinterleaving the data output from the coding of the robust data;

initializing memory at a beginning point of the known data of the data output from the deinterleaving and performing Trellis encoding;

deleting RS parity of data output in the deinterleaving of the data output from the coding of the robust data;

performing second RS encoding of data output in the parity deleting;

interleaving the data output in the second RS encoding; and receiving and temporarily storing, by RS output buffering, the known data of the data output in the second RS encoding from the beginning point.

8. The method as claimed in claim 7, wherein the known data has a predefined certain pattern.

9. The method as claimed in claim 7, wherein the RS output buffering receives and stores the known data altered according to the memory initialization from the Trellis encoding.

10. The method as claimed in claim 9, further comprising:
receiving the altered known data from the RS output buffering and performing RS encoding to generate an altered parity, outputting the altered parity to the Trellis encoding, and replacing parity added in the second RS encoding.

11. The method as claimed in claim 7, wherein the stuff bytes are inserted in an adaptation field of the normal data packet.

12. The method as claimed in claim 7, wherein the normal data packet includes information on length of the inserted stuff bytes being inserted at a certain location.

13. A digital broadcasting transmitter, comprising:
a Transport Stream (TS) stream generator to receive a normal data packet and a robust data packet respectively having stuff bytes inserted at a certain location, and to insert the robust data packet at certain intervals in the normal data packet to generate dual TS stream of a certain format;
a randomizer to randomize the TS stream output from the TS stream generator;
a stuff byte replacing part to replace the stuff bytes of the data output from the randomizer with a predetermined known data;
a first Reed Solomon (RS) encoder to perform RS encoding of the data output from the stuff byte replacing part;
an interleaver to interleave the data output from the first RS encoder;
a symbol processor to perform coding of the robust data of the data output from the interleaver;
a deinterleaver to deinterleave the data output from the symbol processor;
a Trellis encoder to initialize memory of the known data of the data output from the deinterleaver from a beginning point, and to perform Trellis encoding;
a parity deleting part to delete RS parity from the data output from the deinterleaver;
a second RS encoder to perform RS encoding of data output in the parity deleting part;
a reinterleaver to interleave data output in the second RS encoder; and
an RS output buffer to receive the known data from the beginning point of the data output from the second RS encoder and to temporarily store the known data.

14. The digital broadcasting transmitter as claimed in claim 13, the known data has a predetermined certain pattern.

15. The digital broadcasting transmitter as claimed in claim 13, wherein the RS output buffer receives and stores the known data altered according to the memory initialization from the Trellis encoder.

16. The digital broadcasting transmitter as claimed in claim 15, further comprising:
a parity restructuring part to receive the altered known data from the RS output buffer, to perform RS encoding to generate an altered parity, to output the altered parity to the Trellis encoder, and to replace the parity added by the second RS encoder.

17. The digital broadcasting transmitter as claimed in claim 13, wherein the stuff bytes are inserted in adaptation field of the normal data packet and the robust data packet.

18. The digital broadcasting transmitter as claimed in claim 13, wherein the normal data packet and the robust data packet include information on length of the inserted stuff bytes being inserted at a certain location.

19. A method of signal processing for a digital broadcasting transmitter, comprising:
receiving normal data packet and robust data packet respectively having stuff bytes inserted at a certain location, and inserting the robust data packet to the normal data packet at certain intervals to generate dual Transport Stream (TS) stream of a certain format;
randomizing the generated TS stream;
replacing the stuff bytes of data output from the randomizing of the TS stream with a predetermined known data;
performing first Reed Solomon (RS) encoding of data output from the replacing of the stuff bytes;
interleaving data output from the first RS encoding step;
coding the robust data of data output from the interleaving;
deinterleaving data output from the coding of the robust data;
initializing memory at a beginning point of the known data of the data output from the deinterleaving and performing Trellis encoding;
deleting RS parity of data output in the deinterleaving of the data output from the coding of the robust data;
performing second RS encoding of data output in the parity deleting step;
interleaving data output in the second RS encoding; and
receiving and temporarily storing, by RS output buffering, the known data of the data output in the second RS encoding step from the beginning point.

20. The method as claimed in claim 19, wherein the known data has a predetermined certain pattern.

21. The method as claimed in claim 20, wherein the RS output buffering receives and stores the known data altered according to the memory initialization from the Trellis encoding.

22. The method as claimed in claim 21, further comprising:
receiving the altered known data from the RS output buffering and performing RS encoding to generate an altered parity, outputting the altered parity to the Trellis encoding, and replacing parity added in the second RS encoding.

23. The method as claimed in claim 19, wherein the stuff bytes are inserted in adaptation field of the normal data packet and the robust data packet.

24. The method as claimed in claim 19, wherein the normal data packet and the robust data packet include information on length of the inserted stuff bytes at a certain location.

25. A digital broadcasting transmitter, comprising:
a data pre-processor to process supplementary data, wherein the supplementary data is Reed-Solomon (RS) encoded, interleaved and formatted by the data pre-processor;
a first multiplexer to output a data stream including the supplementary data processed by the data pre-processor;
an RS encoder to perform RS encoding on the data stream including the supplementary data to add an RS parity thereto;
a Trellis encoder to perform Trellis encoding on the data stream including the supplementary data using internal memories; and
a parity restructuring part to generate another RS parity according to data changed by the initialized internal memories of the Trellis encoder so that the RS parity added by the RS encoder is replaced with the other RS parity,
wherein the Trellis encoder initializes the internal memories at a beginning of known data and performs Trellis encoding the known data using the initialized internal memories, and
wherein the known data is a predefined signal pattern that is known to both the digital broadcasting transmitter and a digital broadcasting receiver and is used for equalization in the digital broadcasting receiver.

26. The digital broadcasting transmitter as claimed in claim 25, further comprising:
a known data processor to include the known data in the data stream according to a control information to control the known data to be inserted.

27. The digital broadcasting transmitter as claimed in claim 26, wherein the data pre-processor comprises:
the Reed Solomon (RS) encoder to receive the supplementary data, and performing RS encoding on the supplementary data;
an interleaver to interleave the RS encoded supplementary data; and
a packet formatter to format the interleaved supplementary data.

28. The digital broadcasting transmitter as claimed in claim 27, further comprising:
a randomizer to randomize the data stream output by the first multiplexer, and provide the known data processor with the randomized data stream;
if the known data processor includes the known data in the randomized data stream and outputs the data stream, a first RS encoder to perform RS encoding on the data stream;
an interleaver to interleave the RS encoded data stream;
a symbol processor to code the supplementary data among the interleaved data stream;
a de-interleaver to de-interleave the data stream output by the symbol processor;
an RS parity removing unit to remove a parity from the coded data among the de-interleaved data stream;
a second RS encoder to perform RS encoding on the data removing the parity in order to perform Vestigial Sideband (VSB) transmission channel coding;
a reinterleaver to re-interleave the data stream RS encoded by the second RS encoder, and provide the Trellis encoder with the data stream;
a parity restructuring part to compensate a parity according to the data initialized by the Trellis encoder; and
a second multiplexer to multiplex a segment sync and a field sync in the data stream output from the Trellis encoder.

29. The digital broadcasting transmitter as claimed in claim 26, further comprising:
an encoder to encode the data stream processed by the known data processor.

30. The digital broadcasting transmitter as claimed in claim 29, further comprising:
a randomizer to randomize the data stream, and provide the known data processor with the randomized data stream.

31. The digital broadcasting transmitter as claimed in claim 26, further comprising:
a Reed Solomon (RS) encoder to encode the data stream processed by the known data processor;
an interleaver to interleave the encoded data stream; and
a Trellis encoder to perform Trellis encoding on the interleaved data stream.

32. The digital broadcasting transmitter as claimed in claim 31, wherein the control information is provided to at least one of the known data processor, the interleaver, and the Trellis encoder.

33. The digital broadcasting transmitter as claimed in claim 25, further comprising:
a multiplexer to multiplex the supplementary data processed by the data pre-processor on the data stream.

34. The digital broadcasting transmitter as claimed in claim 33, wherein the data pre-processor comprises:
a Reed Solomon (RS) encoder to receive the supplementary data, and perform RS encoding on the supplementary data;
an interleaver to interleave the RS encoded supplementary data; and
a packet formatter to format the interleaved supplementary data, and output the formatted supplementary data to the multiplexer.

35. The digital broadcasting transmitter as claimed in claim 25, wherein the data pre-processor comprises:
a Reed Solomon (RS) encoder to receive the supplementary data, and to perform RS encoding on the supplementary data;
an interleaver to interleave the RS encoded supplementary data; and
a packet formatter to format the interleaved supplementary data, and to output the formatted supplementary data.

36. The digital broadcasting transmitter as claimed in claim 25, wherein the supplementary data is processed to be robust against errors.

37. The digital broadcasting transmitter as claimed in claim 25, wherein the supplementary data stream is de-interleaved.

38. A method of processing a stream of a digital broadcasting transmitter, the method comprising:
processing supplementary data to be robust against errors, wherein the supplementary data is Reed-Solomon (RS) encoded, interleaved and formatted;
multiplexing the processed supplementary data to a data stream;
performing RS encoding on the data stream including the supplementary data to add an RS parity thereto;
performing Trellis encoding on the data stream using a Trellis encoder including internal memories;
initializing the internal memories at a beginning of known data, and performing Trellis encoding the known data using the initialized internal; and
generating an RS parity according to data changed by the initialized internal memories of the Trellis encoder so that the RS parity added by the RS encoder is replaced with the RS parity generated according to the changed data, wherein the known data is a predefined signal pattern that is known to both the digital broadcasting transmitter and a digital broadcasting receiver and is used for equalization in the digital broadcasting receiver.

39. The method as claimed in claimed 38, further comprising:
if a control information to control an insertion process of the known data is generated, inserting known data in the data stream including the supplementary data according to the generated control information.

40. The method as claimed in claim 39, wherein the processing comprises:
receiving the supplementary data, and performing Reed Solomon (RS) encoding of the supplementary data;
interleaving the RS encoded supplementary data; and
formatting the interleaved supplementary data.

41. The method as claimed in claim 39, further comprising:
multiplexing the processed supplementary data to a data stream.

42. The method as claimed in claim 41, wherein the processing comprises:
receiving the supplementary data, and performing RS encoding of the supplementary data;
interleaving the RS encoded supplementary data; and
formatting the interleaved supplementary data.

43. The method as claimed in claim 39, further comprising: encoding the processed data stream.

44. The method as claimed in claim 43, further comprising: randomizing the data stream prior to encoding the data stream.

45. The method as claimed in claim 39, further comprising:
randomizing a data stream having the supplementary data;
if the randomized data stream includes the known data, performing Reed Solomon (RS) encoding on the data stream having the known data;
interleaving the RS encoded data stream;
coding the supplementary data among the interleaved data streams;
de-interleaving the coded data stream;
removing a parity from the coded data among the de-interleaved data stream;
performing RS encoding on the data stream removing the parity in order to perform Vestigial Sideband (VSB) transmission channel coding;
re-interleaving the RS encoded data stream, and providing the Trellis encoder with the data stream;
compensating a parity according to the data initialized by the Trellis encoder, if the Trellis encoder initializes internal memories of the Trellis encoder at a predetermined point; and
multiplexing a segment sync and a field sync on the data stream output from the Trellis encoder.

46. The method as claimed in claim 39, further comprising:
encoding the processed data stream;
interleaving the encoded data stream; and
performing Trellis encoding on the interleaved data stream.

47. The method as claimed in claim 46, wherein at least one of the encoding, interleaving, and Trellis encoding uses the control information.

48. The method as claimed in claim 38, wherein the processing comprises:
receiving the supplementary data, and performing Reed Solomon (RS) encoding on the supplementary data;
interleaving the RS encoded supplementary data; and
formatting the interleaved supplementary data.

49. The method as claimed in claim 38, wherein the supplementary data stream is de-interleaved.

50. A digital broadcasting system, comprising:
the digital broadcasting transmitter of claim 25; and
a digital broadcasting receiver to receive the data stream transmitted from the digital broadcasting transmitter.

51. The system as claimed in claim 50, further comprising:
a control information generator to provide the Trellis encoder with the generated control information.

52. The system as claimed in claim 51, wherein the data pre-processor comprises:
a Reed Solomon (RS) encoder to receive the supplementary data, and to perform RS encoding on the supplementary data;
an interleaver to interleave the RS encoded supplementary data; and a packet formatter to format the interleaved supplementary data.

53. The system as claimed in claim 52, wherein the operation of formatting a data stream comprises one of operations of inserting packet identification (PID), duplicating, formatting a data stream to be inserted between normal packets.

54. The system as claimed in claim 51, wherein the digital broadcasting transmitter further comprises:
a Reed Solomon (RS) encoder to encode the data stream processed by the known data processor;
an interleaver to interleave the encoded data stream; and
the Trellis encoder to perform Trellis encoding on the interleaved data stream.

55. The system as claimed in claim 51, wherein the control information generator provides the control information to at least one of the known data processor, an interleaver, and the Trellis encoder.

56. The system as claimed in claim 50, wherein the digital broadcasting receiver further comprises:
a demodulator to demodulate a received data stream;
an equalizer to equalize the data stream;
a de-multiplexer to separate the data stream into normal data and supplementary data; and
a robust data processor to decode the separated supplementary data.

57. The system as claimed in claim 56, further comprising:
a digital broadcasting receiver including:
a known data detector to detect known data from a demodulated data stream,
wherein at least one of the demodulator and the equalizer demodulates or equalizes a data stream according to the known data.

58. The system as claimed in claim 50, wherein the supplementary data stream is de-interleaved.

59. A digital broadcast transmitter, comprising:
a robust data pre-processor to process a robust data to generate a robust data packet of a predetermined format;
a Transport Stream (TS) stream generator to receive a normal data packet, including stuff bytes inserted in a certain location, and to insert the robust data packet at certain intervals to the normal data packets to generate a dual TS stream;
a randomizer to randomize the TS stream output from the TS stream generator;
a stuff byte replacing part to replace the stuff bytes of the data output from the randomizer with a predetermined known data;
an encoder to encode the data output from the stuff byte replacing part to be transmitted by the digital broadcast transmitter;
a parity deleting part to delete a parity from the data output from the encoder;
a Reed Solomon (RS) encoder to perform encoding of the data output from the parity deleting part;

a reinterleaver to interleave the data output from the RS encoder; and an RS output buffer to receive the known data from the beginning point of the data output from the RS encoder and to temporarily store the known data.

60. A method of signal processing with a digital broadcasting transmitter, the method comprising:

processing a robust data with a robust data pre-processor of the digital broadcasting transmitter to generate a robust data packet of a predetermined format;

receiving a normal data packet that includes stuff bytes inserted in a certain location, and inserting the robust data packet at certain intervals to the normal data packets to generate a dual transport stream (TS) with a TS stream generator of the digital broadcasting transmitter;

randomizing the TS stream output from the TS stream generator with a randomizer of the digital broadcasting transmitter;

replacing the stuff bytes of the data output from the randomizer with a predetermined known data with a stuff byte replacing part of the digital broadcasting transmitter;

encoding the data output from the stuff byte replacing part with an encoder to be transmitted by the digital broadcast transmitter;

deleting a parity with a parity deleting part from the data output from the encoder;

performing encoding with a Reed Solomon (RS) encoder of the data output from the parity deleting part;

interleaving the data output from the RS encoder with a reinterleaver; and receiving and temporarily storing, by RS output buffering, the known data of the data output in the RS encoding from the beginning point.

* * * * *